United States Patent
Denpoh (10) Patent No.: US 7,847,247 B2
(45) Date of Patent: Dec. 7, 2010

(54) METHOD OF PLASMA PARTICLE SIMULATION, STORAGE MEDIUM, PLASMA PARTICLE SIMULATOR AND PLASMA PROCESSING APPARATUS

(75) Inventor: Kazuki Denpoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 175 days.

(21) Appl. No.: 12/198,420

(22) Filed: Aug. 26, 2008

(65) Prior Publication Data

US 2009/0057578 A1    Mar. 5, 2009

Related U.S. Application Data

(60) Provisional application No. 60/983,278, filed on Oct. 29, 2007.

(30) Foreign Application Priority Data

Aug. 27, 2007    (JP) ............... 2007-220099

(51) Int. Cl.
*G21G 4/00* (2006.01)
(52) U.S. Cl. ............ 250/290; 250/281; 250/282; 250/288; 250/492.21; 438/513; 438/706; 438/710
(58) Field of Classification Search ............... None
See application file for complete search history.

(56) References Cited

U.S. PATENT DOCUMENTS

| | | | |
|---|---|---|---|
| 6,514,347 B2 * | 2/2003 | Denpoh | 118/715 |
| 6,828,243 B2 * | 12/2004 | Denpoh | 438/706 |
| 7,225,082 B1 * | 5/2007 | Natan et al. | 702/27 |
| 7,691,226 B2 * | 4/2010 | Denpoh | 156/345.24 |
| 2004/0261946 A1 * | 12/2004 | Endoh et al. | 156/345.15 |
| 2006/0214593 A1 * | 9/2006 | Denpoh | 315/111.81 |
| 2009/0057578 A1 * | 3/2009 | Denpoh | 250/493.1 |
| 2009/0120582 A1 * | 5/2009 | Koshimizu et al. | 156/345.34 |

FOREIGN PATENT DOCUMENTS

JP    8-235156    9/1996

OTHER PUBLICATIONS

Hideto Takekida, et al., "Weighting Factor for Modeling of Axisymmetrical Low Temperature Plasmas", Journal of the Physical Society of Japan, vol. 73, No. 3, The Physical Society of Japan, Mar. 2004, pp. 756-757.

Kazuki Denpoh, et al., "Self-consistent particle simulation of radio-frequency CF4 discharge with implementation of all ion-neutral reactive collisions", Journal of Vacuum Science & Technology A, American Vacuum Society, May/Jun. 1998, pp. 1201-1206.

* cited by examiner

*Primary Examiner*—David A Vanore
(74) *Attorney, Agent, or Firm*—Oblon, Spivak, McClelland, Maier & Neustadt, L.L.P.

(57) ABSTRACT

A method of plasma particle simulation capable of preventing solution divergence. A space within a housing chamber of a plasma processing apparatus is divided into a plurality of cells. A weighting factor corresponding to the number of plasma particles represented by a superparticle is set in each of the divided cells. Superparticles are set in each of the divided cells using plasma particles contained in the divided cell and the set weighting factor. The behavior of the superparticles in each of the divided cells is calculated. The weighting factor becomes smaller as the divided cell is located closer to a solid wall surface of the housing chamber.

11 Claims, 8 Drawing Sheets

METHOD OF PLASMA PARTICLE SIMULATION, STORAGE MEDIUM, PLASMA PARTICLE SIMULATOR AND PLASMA PROCESSING APPARATUS

BACKGROUND OF THE INVENTION

1. Field of the Invention

The present invention relates to a method of plasma particle simulation, a storage medium, a plasma particle simulator and a plasma processing apparatus, and more particularly, to a method of plasma particle simulation for plasma with a sheath.

2. Description of the Related Art

A plasma processing apparatus for subjecting a plasma processing to a wafer or the like using plasma includes a housing chamber for housing the wafer. Within the housing chamber, there is generated plasma. Since a plasma distribution has a significant effect on the uniformity of processing subject to the wafer, many attempts have been heretofore made in order to know the distribution of plasma within the housing chamber.

As a method for directly observing the plasma distribution, there is known a method for observing a state of light emission within the housing chamber. Since being based on optical methodology, the aforementioned method has many factors of disturbance and, hence, a poor accuracy of observation. Accordingly, a multitude of simulations has been run in recent years, in order to predict a distribution of plasma particles and a temperature distribution by calculating the behavior of plasma particles (radicals, positive ions, electrons and the like) using a computer. In these simulations, there is often used a calculation technique known as the Monte Carlo method.

The Monte Carlo method is a calculation technique used to determine numerical solutions by stochastically solving equations. In particular, there is suitably used in plasma particle simulation, the Particle-in-Cell, Monte-Carlo-Collision (PIC-MCC) method in which the behavior of each plasma particle is mathematized, a space within the housing chamber as an objective space to be calculated is divided into a plurality of cells, and the behavior calculation of each plasma particle in each cell is statistically performed on the basis of mathematical expressions.

On the other hand, the number of plasma particles contained in the housing chamber is enormous. Consequently, performing a behavior calculation for each of plasma particles requires an enormous computational load, thus taking a vast amount of time for simulation. Hence, a concept called a superparticle which represents a large number of plasma particles (for example, 107 particles) is applied in the simulation of plasma particle behavior using the Monte Carlo method. Here, the number of plasma particles represented by one superparticle is referred to as a "weighting factor." In this case, a behavior calculation is made for each superparticle rather than for each plasma particle. Thus, the calculation load (memory and time) and calculation cost are prevented from increasing to vast amounts (see, for example, Japanese Laid-Open Patent Publication (Kokai) No. 8-235156).

Figure 10:
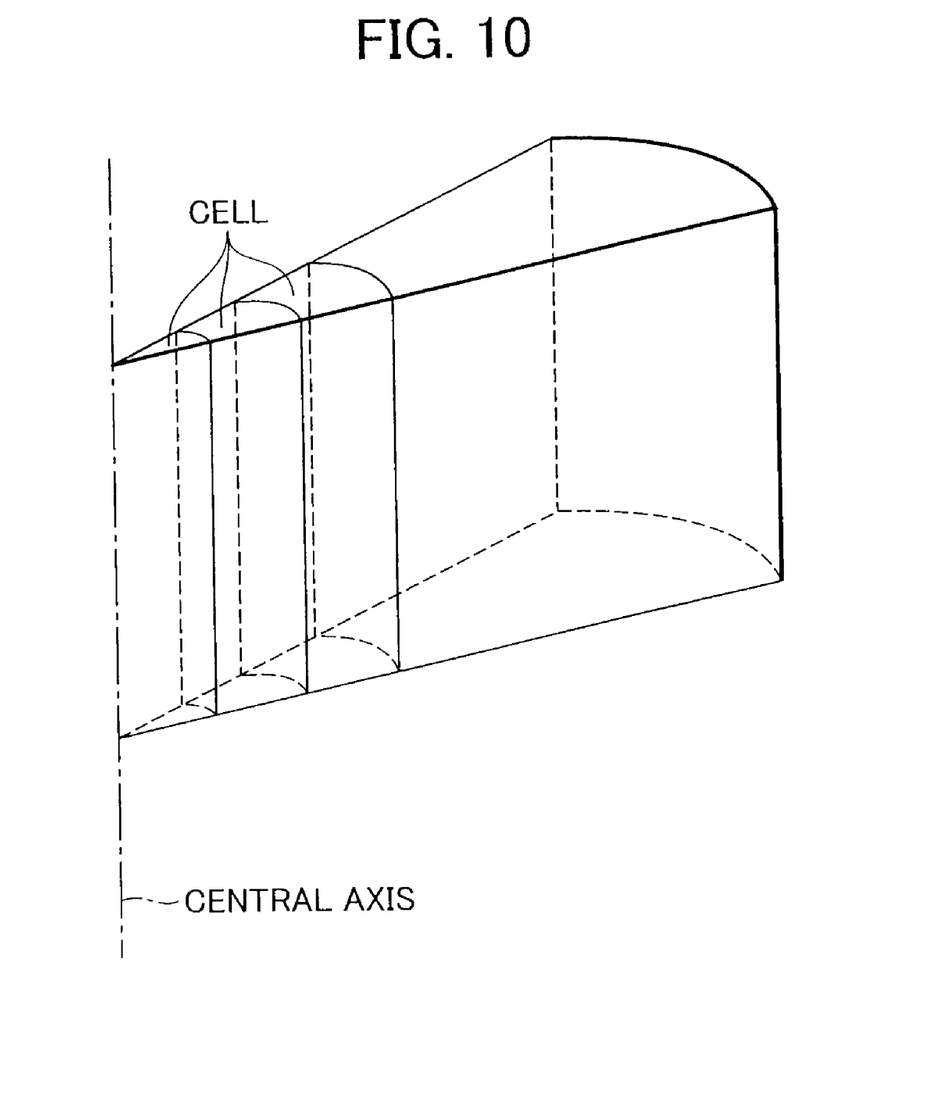
FIG. 10 is a perspective view illustrating a case in which a space within a cylindrical housing chamber is divided axisymmetrically with respect to the central axis thereof into a plurality of cells.

Incidentally, the housing chamber of the processing apparatus is generally specified as taking on a cylindrical shape in the simulation of plasma particle behavior. Consequently, if the space within the housing chamber is divided axisymmetrically with respect to the central axis thereof into a plurality of cells, the volume of a cell near the central axis becomes small (see FIG. 10). Assuming at this point that the density of plasma particles in the space is constant, then the number of plasma particles contained in a cell near the central axis decreases. As a result, the number of superparticles subject to behavior calculation also decreases. On the other hand, the Monte Carlo method has the problem that a statistical error in calculations becomes larger as the number of superparticles decreases.

What is required in order to control the statistical error is to increase the number of superparticles contained in a cell. In response to this requirement, there has been proposed a method for maintaining the number of superparticles contained in a cell near the central axis even if the number of plasma particles decreases, by making the weighting factor smaller as the cell is located closer to the central axis (see, for example, Hideto TAKEIDA and Kenichi NANBU, "Weighting factor for Particle Modeling of Axisymmetrical Low Temperature Plasma", Journal of the Physical Society of Japan, Vol. 73, No. 3, The Physical Society of Japan, Mar. 2004, p. 756-757). In addition, a method for maintaining the number of superparticles contained in cells near the central axis by applying an extremely small weighting factor to every cell, has also been implemented by the present inventor et al. (see, for example, Kazuki DENPOH and Kenichi NANBU, "Self-consistent particle simulation of radio-frequency CF4 discharge with implementation of all ion-neutral reactive collisions", Journal of vacuum Science & Technology A, American Vacuum Society, May/June 1998, p. 1201-1206).

However, sheaths are produced in the vicinity of solid wall surfaces (e.g., sidewall and ceiling wall) of the housing chamber when plasma is generated therein. A sheath is a region which is produced due to a difference between electrons and positive ions in the speed of arrival at a solid wall surface and in which the density of plasma particles, particularly electrons, is low. Accordingly, if a real plasma particle distribution is reflected in the simulation of plasma particles, the number of plasma particles contained in a cell near a solid wall surface becomes small in a case where the space within the housing chamber is divided into a plurality of cells.

Furthermore, since a potential difference and an electric field gradient are large in a sheath, a portion where the sheath is produced (portion near the solid wall surface) generally needs to be divided into a large number of cells, in order to improve calculation accuracy. This means that the number of plasma particles contained in a cell near the solid wall surface also becomes small.

As described above, the number of superparticles subject to behavior calculation also decreases in the cell near the solid wall surface and, therefore, a statistical error in behavior calculation becomes large. As a result, it is no longer possible to ensure consistency with the results of behavior calculation of superparticles in the portion (bulk) of plasma other than the sheath, possibly causing a solution to diverge in plasma particle simulation.

SUMMARY OF THE INVENTION

The present invention provides a method of plasma particle simulation capable of preventing solution divergence, a storage medium, a plasma particle simulator, and a plasma processing apparatus.

Accordingly, in a first aspect of the present invention, there is provided a method of plasma particle simulation for analyzing the behavior of a plasma particle in plasma generated in a housing chamber included by a plasma processing apparatus by calculating the behavior of a superparticle which is a virtual particle representing a plurality of plasma particles, comprising a cell division step of dividing a space within the housing chamber into a plurality of cells, a weighting factor setting step of setting a weighting factor corresponding to the number of the plasma particles represented by the superparticle in each of the divided cells, a superparticle setting step of setting superparticles in each of the divided cells using plasma particles contained in the divided cell and the set weighting factor, and a behavior calculation step of calculating the behavior of the superparticles in each of the divided cells, wherein the weighting factor becomes smaller as the divided cell is located closer to a solid wall surface of the housing chamber.

According to a first aspect of the present invention, a weighting factor corresponding to the number of plasma particles represented by a superparticle becomes smaller as the divided cell in which the weighting factor is set is located closer to a solid wall surface of an housing chamber. Consequently, it is possible to maintain the number of superparticles in the divided cell which is located near the solid wall surface and, therefore, contains a small number of plasma particles, and prevent a statistical error from becoming large in behavior calculation, thereby preventing solution divergence and improving solution accuracy.

The first aspect of the present invention can provide a method of plasma particle simulation further comprising a plasma particle default-setting step of default-setting the plasma particles in each of the divided cells.

According to the first aspect of the present invention, since plasma particles are default-set in each divided cell, it is possible to rapidly converge behavior calculations and improve solution accuracy further.

The first aspect of the present invention can provide a method of plasma particle simulation, wherein a plurality of weighting functions representing a relationship between a distance of the divided cell from the solid wall surface and the weighting factor are prepared, one of the weighting functions is selected in the weighting factor setting step on the basis of a state of plasma predicted to be generated within the housing chamber, and the weighting factor is set in each of the divided cells using the selected weighting function.

According to the first aspect of the present invention, since one of weighting functions is selected on the basis of the state of plasma predicted to be produced within the housing chamber and a weighting factor is set in each divided cell using the selected weighting function, it is possible to maintain an appropriate number of superparticles in each cell according to the plasma state, thereby reliably preventing solution divergence. In addition, it is possible to improve solution accuracy further.

The first aspect of the present invention can provide a method of plasma particle simulation, wherein the weighting function is based on a trigonometric function.

According to the first aspect of the present invention, the weighting function is based on a trigonometric function. Since the value of a trigonometric function changes drastically, the value of the weighting factor in the weighting function can be varied over three or more orders of magnitude according to a distance from the solid wall surface. Consequently, it is possible to maintain an appropriate number of superparticles in each cell even in the case of a plasma state in which the number of plasma particles changes drastically over as much as three or more orders of magnitude in a sheath, thereby even more reliably preventing solution divergence. In addition, it is possible to reliably improve solution accuracy.

The first aspect of the present invention can provide a method of plasma particle simulation, wherein an increase/decrease in the number of the superparticles is determined using a probabilistic measure when the superparticles move from one of the divided cells to another one of the divided cells adjacent thereto.

According to the first aspect of the present invention, an increase/decrease in the number of superparticles is determined using a probabilistic measure when superparticles move from one cell to an adjacent cell. Consequently, it is possible to appropriately achieve the cell-to-cell move of superparticles even if the weighting factors of mutually adjacent cells differ, thereby smoothly performing behavior calculations.

The first aspect of the present invention can provide a method of plasma particle simulation, wherein the housing chamber is specified as taking on a cylindrical shape in the behavior calculation of the superparticles, a space within the housing chamber is divided axisymmetrically with respect to the central axis thereof into a plurality of cells in the divided cell division step, and a smaller weighting factor is set in any of the divided cells located closer to the central axis in the weighting factor setting step.

According to the first aspect of the present invention, a smaller weighting factor is set in the divided cell located closer to the central axis of the housing chamber, among a plurality of cells into which the space within the housing chamber specified as taking on a cylindrical shape in superparticle behavior calculation has been divided axisymmetrically with respect to the central axis. Consequently, it is possible to maintain an appropriate number of superparticles even in the divided cell which is located closer to the central axis and, therefore, contains a smaller number of plasma particles, thereby preventing solution divergence.

Accordingly, in a second aspect of the present invention, there is provided a computer-readable storage medium for storing a program whereby a computer implements a method of plasma particle simulation for analyzing the behavior of a plasma particle in plasma generated in a housing chamber included by a plasma processing apparatus by calculating the behavior of a superparticle which is a virtual particle representing a plurality of plasma particles, the method comprising a cell division step of dividing a space within the housing chamber into a plurality of cells, a weighting factor setting step of setting a weighting factor corresponding to the number of the plasma particles represented by the superparticle in each of the divided cells, a superparticle setting step of setting superparticles in each of the divided cells using plasma particles contained in the divided cell and the set weighting factor, and a behavior calculation step of calculating the behavior of the superparticles in each of the divided cells, wherein the weighting factor becomes smaller as the divided cell is located closer to a solid wall surface of the housing chamber.

Accordingly, in a third aspect of the present invention, there is provided a plasma particle simulator for implementing a method of plasma particle simulation for analyzing the behavior of a plasma particle in plasma generated in an housing chamber included by a plasma processing apparatus by calculating the behavior of a superparticle which is a virtual particle representing a plurality of plasma particles, comprising a cell division unit adapted to divide a space within the housing chamber into a plurality of cells, a weighting factor setting unit adapted to set a weighting factor corresponding to the number of the plasma particles represented by the superparticle in each of the divided cells, a superparticle setting unit adapted to set superparticles in each of the divided cells using plasma particles contained in the divided cell and the set weighting factor, and a behavior calculation unit adapted to calculate the behavior of the superparticles in each of the divided cells, wherein the weighting factor becomes smaller as the divided cell is located closer to a solid wall surface of the housing chamber.

Accordingly, in a fourth aspect of the present invention, there is provided a plasma processing apparatus provided with an housing chamber in which plasma is generated and a plasma particle simulator for implementing a method of plasma particle simulation for analyzing the behavior of a plasma particle in plasma generated in the housing chamber by calculating the behavior of a superparticle which is a virtual particle representing a plurality of plasma particles, wherein the plasma particle simulator includes a cell division unit adapted to divide a space within the housing chamber into a plurality of cells, a weighting factor setting unit adapted to set a weighting factor corresponding to the number of the plasma particles represented by the superparticle in each of the divided cells, a superparticle setting unit adapted to set superparticles in each of the divided cells using plasma particles contained in the divided cell and the set weighting factor, and a behavior calculation unit adapted to calculate the behavior of the superparticles in each of the divided cells, wherein the weighting factor becomes smaller as the divided cell is located closer to a solid wall surface of the housing chamber.

The features and advantages of the invention will become more apparent from the following detailed description taken in conjunction with the accompanying drawings.

DESCRIPTION OF THE PREFERRED EMBODIMENTS

Hereinafter, embodiments of the present invention will be described while referring to the accompanying drawings.

First, an explanation will be made of a method of plasma particle simulation according to a first embodiment of the present invention.

Figure 1:
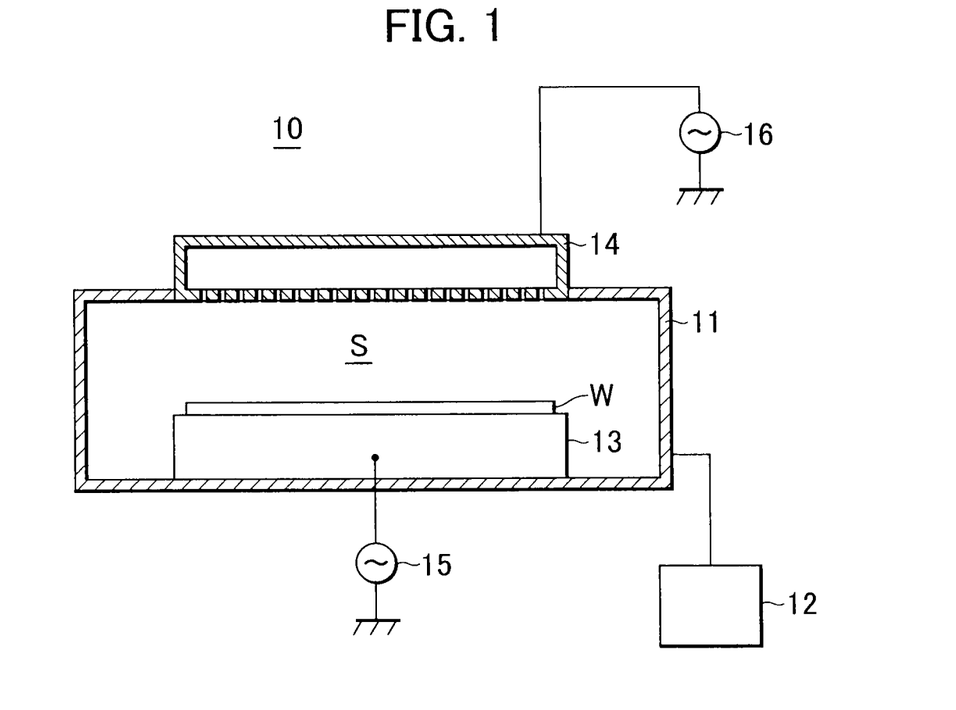
FIG. 1 is a cross-sectional view schematically illustrating a configuration of a plasma processing apparatus to which a method of plasma particle simulation according to a first embodiment of the present invention is applied.

FIG. 1 is a cross-sectional view schematically illustrating a configuration of a plasma processing apparatus to which a method of plasma particle simulation according to the present embodiment.

In FIG. 1, a plasma processing apparatus 10 includes a housing chamber (chamber) 11 for housing a wafer W and a simulator 12 for performing plasma particle distribution prediction processing as a later-described method of plasma particle simulation.

The chamber 11 includes a susceptor 13 functioning as the mounting stage of the wafer W and disposed downwardly within the chamber 11, and a showerhead 14 disposed above the chamber 11 to supply a processing gas into the chamber 11. Since a radio-frequency power source 15 is connected to the susceptor 13, the susceptor 13 functions as a lower electrode for applying radio-frequency power to a space (hereinafter referred to as the "processing space") S within the chamber 11. In addition, since another radio-frequency power source 16 is connected to the showerhead 14, the showerhead 14 functions as an upper electrode for applying radio-frequency power to the processing space S. Note here that the chamber 11 takes on a cylindrical shape and, therefore, the processing space S is also cylindrical.

In the plasma processing apparatus 10, a processing gas supplied from the showerhead 14 to the processing space S is excited by radio-frequency power applied by the susceptor 13 and the showerhead 14 and is turned into plasma. The plasma applies a desired plasma processing, for example, an etching processing on the wafer W.

Figure 2:
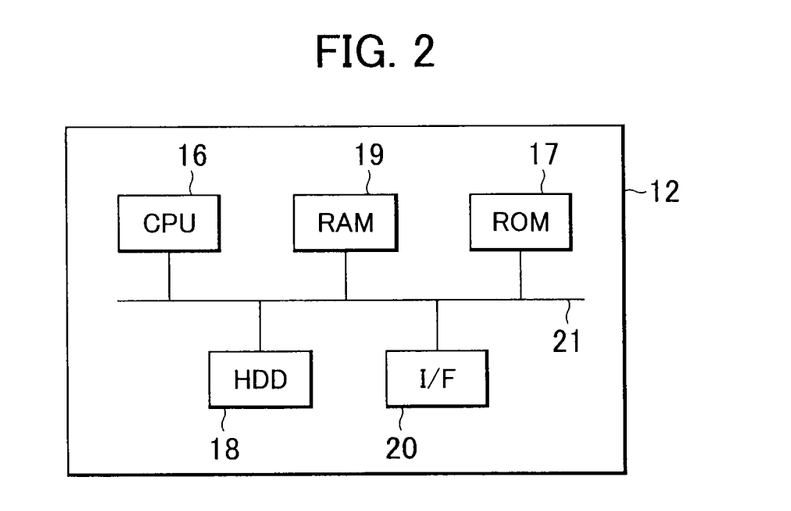
FIG. 2 is a block diagram schematically illustrating a configuration of a simulator appearing in FIG. 1.

FIG. 2 is a block diagram schematically illustrating a configuration of a simulator appearing in FIG. 1.

In FIG. 2, the simulator 12 is, for example, a computer system, such as a personal computer or a workstation, including: a CPU 16 (cell-diving unit, weighting factor setting unit, superparticle setting unit, and behavior calculation unit) for performing later-described plasma particle distribution prediction processing; a ROM 17 in which a program and the like related to the plasma particle distribution prediction processing are previously stored; a hard disk 18 which is a large-capacity storage unit for storing later-described various weighting functions and the like used in the plasma particle distribution prediction processing; a RAM 19 in which the abovementioned data and program are temporarily loaded; and an input-output interface 20 for connecting an input unit, such as an external keyboard and mouse, a display unit, such as an LCD or CRT, and an internal bus 21. The data that the hard disk 18 stores is not limited to the abovementioned weighting functions but includes data related to a later-described initial distribution of plasma particles, recipes of plasma processing to be simulated, and plasma particle distributions predicted by simulation.

Figure 3:
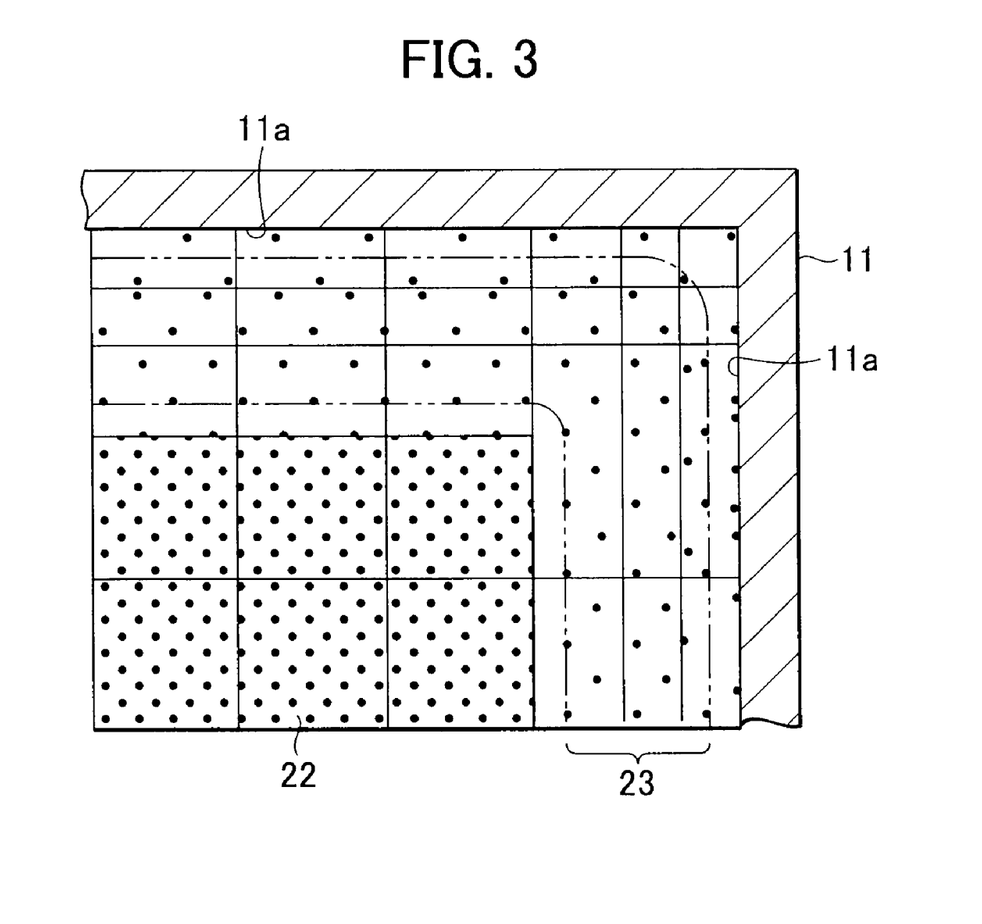
FIG. 3 is a partial cross-sectional view illustrating a distribution of plasma particles near a solid wall surface of a chamber appearing in FIG. 1.

FIG. 3 is a partial cross-sectional view illustrating a distribution of plasma particles near a solid wall surface of a chamber appearing in FIG. 1. Note that each quadrangle formed of thin lines in FIG. 3 denotes each cell.

In FIG. 3, the density of plasma particles 22 shown by black dots is high in a portion (portion corresponding to a bulk) distant from a solid wall surface 11$a$ in a processing space S, whereas the density is low in a sheath 23 near the solid wall surface 11$a$. In addition, the sheath 23 is divided into a large number of cells in order to improve calculation accuracy and, therefore, the volume of each cell is small. As a result, the number of plasma particles 22 contained in a cell near the solid wall surface 11$a$ decreases.

If at this time, the same weighting factor is set in a cell near the solid wall surface 11a and in a cell in the bulk when setting superparticles in each cell, the number of superparticles in the cell near the solid wall surface 11a becomes by far smaller than the number of superparticles in the cell in the bulk. Note here that in the Monte Carlo method, statistical errors in calculations become large if the number of superparticles decreases, as described above. Accordingly, the number of superparticles in a cell near the solid wall surface 11a needs to be maintained almost the same as the number of superparticles in a cell in the bulk.

Figure 4:
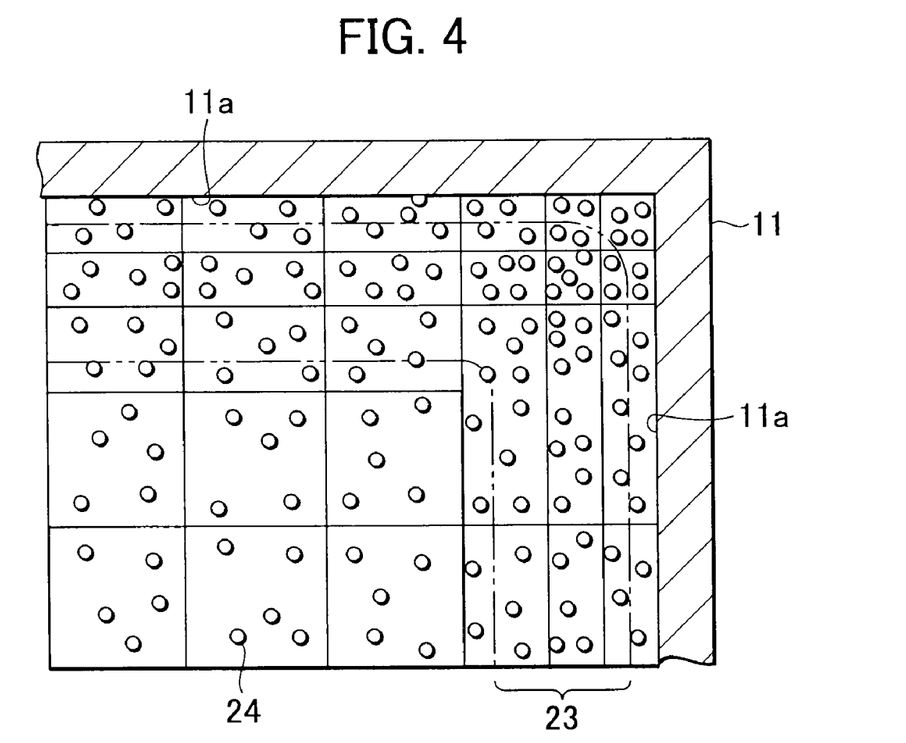
FIG. 4 is a partial cross-sectional view illustrating a distribution of superparticles in each cell near the solid wall surface of the chamber appearing in FIG. 1.

In response to this requirement, in the present embodiment, different weighting factors are set in respective cells according to the position of each cell in the processing space S, without setting the same weighting factor in the respective cells. Specifically, a smaller weighting factor is set in a cell as the cell is located closer to the solid wall surface 11a. Consequently, as shown in FIG. 4, it is possible to maintain the number of superparticles 24 (shown by "○" in the figure) in cells near the solid wall surface 11a almost the same as the number of superparticles 24 in cells in the bulk.

Incidentally, the number of plasma particles 22 in the same cell near the solid wall surface 11a generally differs depending on the state of plasma. In addition, a variation (difference) from the number of plasma particles 22 that a cell in the bulk contains to the number of plasma particles 22 that a cell near the solid wall surface 11a contains also differs depending on the state of plasma.

Consequently, in order to maintain the number of superparticles in the same cell near the solid wall surface 11a almost the same as the number of superparticles in a cell in the bulk even if the state of plasma changes, the weighting factor set in the cell needs to be changed according to the state of plasma.

Hence, in the present embodiment, a weighting function corresponding to each of a plurality of plasma states and representing the relationship between a distance from the solid wall surface 11a and a weighting factor is previously stored on the hard disk 18.

Figure 5:
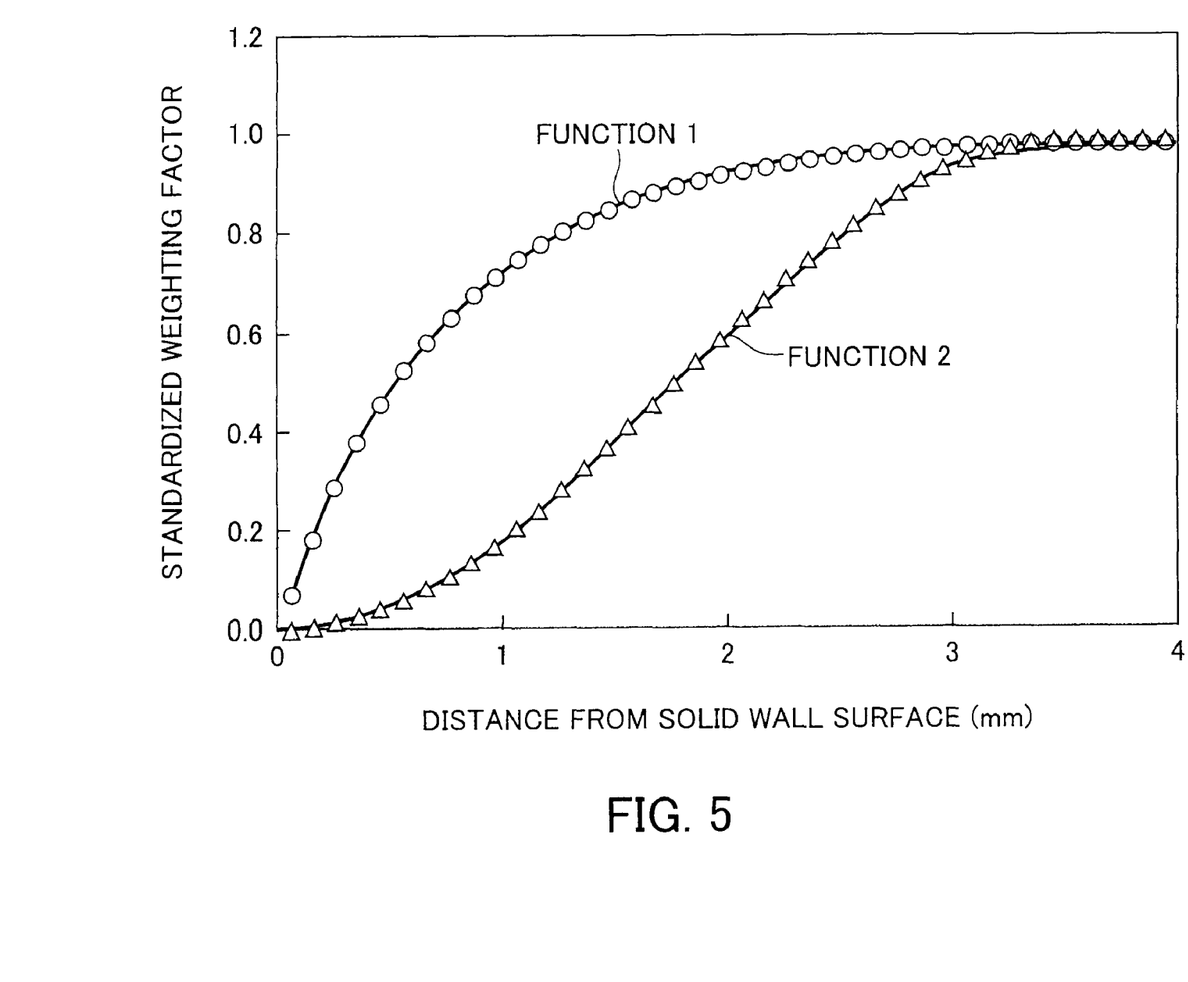
FIG. 5 is a graphical view showing a plurality of weighting function samples that the simulator appearing in FIG. 2 stores on hard disk.

FIG. 5 shows a plurality of weighting function samples that the simulator appearing in FIG. 2 stores on hard disk.

In FIG. 5, each weighting function is represented by the relationship between a distance from the solid wall surface 11a and a standardized weighting factor. Here, the standardized weighting factor is a weighting factor standardized based on the weighting factor of a cell in the bulk. More specifically, the standardized weighting factor is represented as "(weighting factor in target cell)/(weighting factor in cell in bulk)."

Function 1 shown by "○" deals with a plasma state in which the number of plasma particles 22 decreases only in the vicinity of the solid wall surface 11a (the sheath 23 is thin), whereas function 2 shown by "△" deals with a plasma state in which a region where the density of plasma particles 22 is low exists extensively in the vicinity of the solid wall surface 11a (the sheath 23 is thick). Function 1 is a power index-based function, whereas function 2 is a trigonometric function and, more specifically, a function based on equation (1) shown below:

$$W = \frac{1}{2} \times (1 - \cos(\pi \times x/s)) \quad (1)$$

where "W" is a standardized weighting factor, "x" is a distance from the solid wall surface 11a, and "s" is the thickness of a sheath.

In addition, the density of plasma particles 22 is constant and the number of plasma particles 22 that each cell in the bulk contains is the same in a portion corresponding to the bulk (for example, a portion at a distance of 3 mm or longer from the solid wall surface 11a). Since the number of superparticles 24 in each cell is therefore the same even if the same weighting factor is set in each cell in the bulk, there is no need to change the weighting factor. Consequently, the weighting factor remains constant without being changed in either function (function 1 or 2), and "1" is set in each cell in the bulk as a standardized weighting factor.

In plasma particle simulation, consideration needs to given to superparticles 24 which move from one cell to another cell adjacent thereto. If the weighting factors of mutually adjacent cells differ, however, it is not possible to move superparticles 24 in one cell to the adjacent cell while not changing the number of these superparticles 24.

Hence, in the present embodiment, an increase/decrease in the number of superparticles 24 is determined using a probabilistic measure when superparticles 24 move from one cell to an adjacent cell. The probabilistic measure will be explained using FIG. 6.

Figure 6:
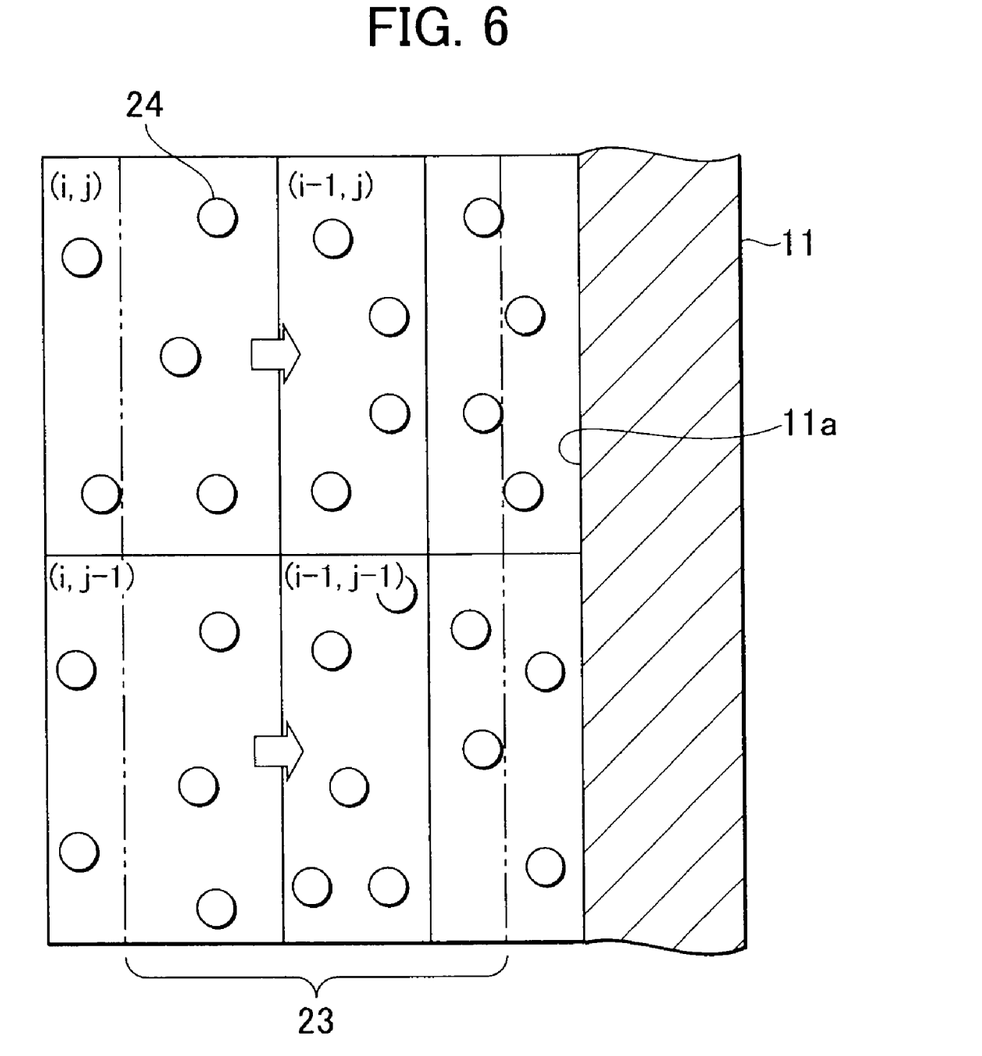
FIG. 6 is a schematic view used to explain an increase/decrease in the number of superparticles when superparticles move from one cell to an adjacent cell.

FIG. 6 is a schematic view used to explain an increase/decrease in the number of superparticles when the superparticles move from one cell to an adjacent cell.

In FIG. 6, there assumed to be four cells, i.e., a cell (i, j), a cell (i−1, j), a cell (i, j−1), and a cell (i−1, j−1) in the vicinity of the solid wall surface 11a. The cell (i, j) and the cell (i−1, j) are adjacent to each other and the cell (i−1, j) is located closer to the solid wall surface 11a than the cell (i, j). Likewise, the cell (i, j−1) and the cell (i−1, j−1) are adjacent to each other and the cell (i−1, j−1) is located closer to the solid wall surface 11a than the cell (i, j−1). It is also assumed that a weighting factor set in the cell (i, j) and the cell (i, j−1) is $W_i$ and a weighting factor set in the cell (i−1, j) and the cell (i−1, j−1) is $W_{i-1}$. Note that in the present embodiment, $W_i > W_{i-1}$ holds true since a weighting factor set in a cell is smaller as the cell is located closer to the solid wall surface 11a.

Here, a case is assumed in which a superparticle 24 moves from the cell (i, j) to the cell (i−1, j) or from the cell (i, j−1) to the cell (i−1, j−1).

In this case, the superparticle 24 moving from the cell (i, j) to the cell (i−1, j) or from the cell (i, j−1) to the cell (i−1, j−1) is divided into $W_i/W_{i-1}$ superparticles 24.

Since $W_i$ is indivisible by $W_{i-1}$ under normal conditions, $W_i/W_{i-1}$ is separated into an integral part I and a decimal part D according to equation (2) shown below:

$$W_i/W_{i-1} = I + D \quad (2)$$

Then, the moved one superparticle 24 is reproduced I−1 times in the cell (i−1, j) (or the cell (i−1, j−1)). In addition, a uniform pseudorandom number U (0<U<1) is determined by the CPU 16. If U<D, then another superparticle 24 is reproduced further (this condition corresponds to, for example, a move from the cell (i, j−1) to the cell (i−1, j−1)) and, if U≧D, then the superparticle 24 is not reproduced any further (this condition corresponds to, for example, a move from the cell (i, j) to the cell (i−1, j)).

When the superparticle 24 moves from the cell (i−1, j) to the cell (i, j) or from the cell (i−1, j−1) to the cell (i, j−1), one superparticle 24 is eliminated at the probability represented by "$1 - W_{i-1}/W_i$." Specifically, a uniform pseudorandom number U (0<U<1) is determined by the CPU 16. If U<$W_{i-1}/W_i$, then the superparticle 24 is moved without being eliminated and, if U≧$W_{i-1}/W_i$, then the superparticle 24 is eliminated. Note that in the present embodiment, $W_{i-1}/W_i < 1$ always holds true.

Consequently, it is possible to appropriately perform the cell-to-cell move of superparticles 24 in the plasma particle simulation even if the weighting factors of mutually adjacent cells differ.

Figure 7:
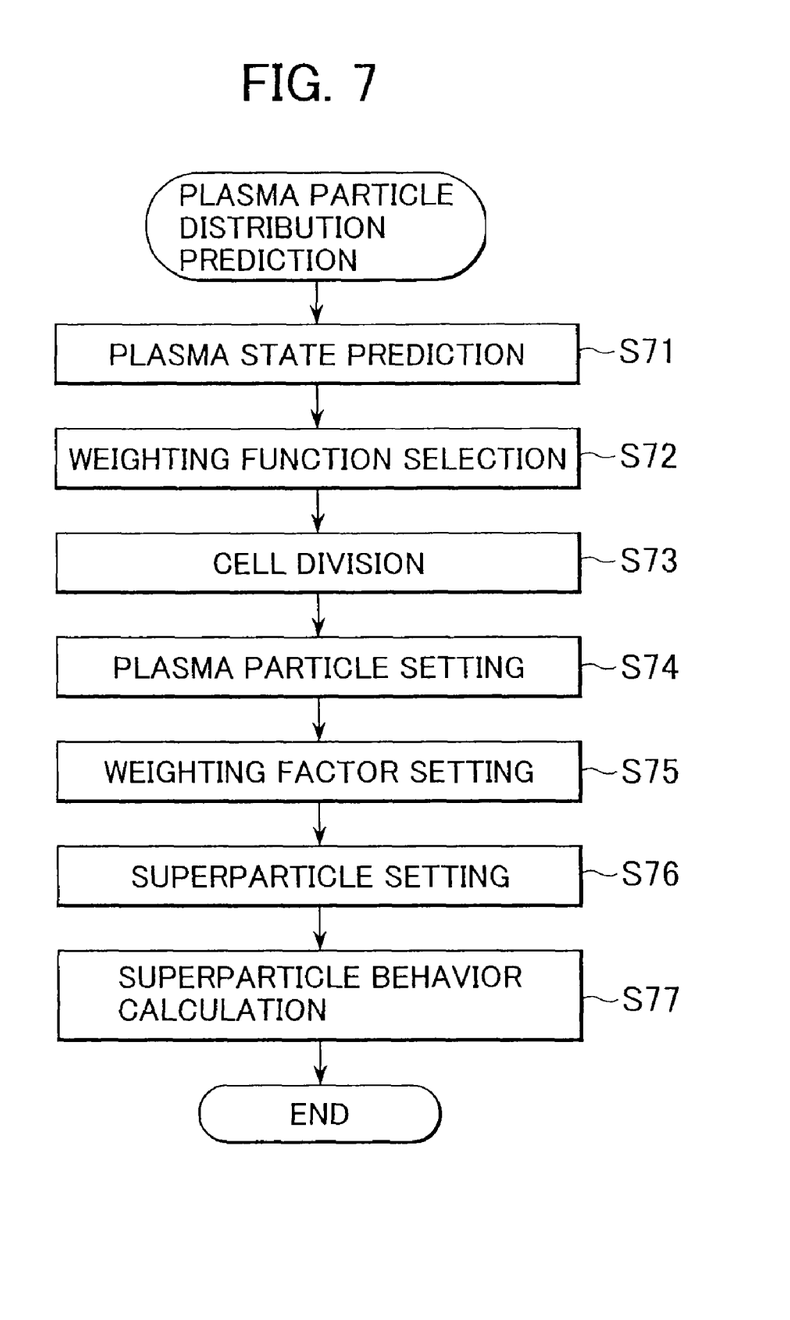
FIG. 7 is a flowchart of plasma particle distribution prediction processing as a method of plasma particle simulation according to the present embodiment.

FIG. 7 is a flowchart of plasma particle distribution prediction processing as a method of plasma particle simulation according to the present embodiment.

First, in FIG. 7, a simulator 12 predicts the state of plasma to be generated in a processing space S from a user-input plasma processing recipe or the like (step S71).

Next, the simulator 12 selects a weighting function to be used in the simulation on the basis of the predicted state of plasma (step S72), reads the weighting function out from the hard disk 18, and divides a simulation model corresponding to the processing space S into a plurality of cells in consideration of the predicted state of plasma, for example, the position and thickness of the sheath 23 (step S73) (cell division step).

Next, the simulator 12 uniformly sets plasma particles 22 in each cell of the simulation model (step S74), and further sets a weighting factor in each cell on the basis of the weighting function read out in step S72 (step S75) (weighting factor setting step). At this time, a weighting factor set in a cell becomes smaller as the cell is located closer to the solid wall surface 11a.

Next, the simulator 12 sets superparticles 24 in each cell on the basis of the plasma particles 22 set in step S74 and the weighting factors set in step S75 (step S76) (superparticle setting step). Here, the simulator 12 calculates the number of superparticles 24 by dividing the number of plasma particles 22 by the weighting factor in each cell.

Next, the simulator 12 calculates the behavior of superparticles 24 in each cell (step S77) (behavior calculation step), and predicts the distribution of plasma particles 22 in the processing space S on the basis of the calculation results. Here, the simulator 12 determines an increase/decrease in the number of superparticles 24 using the above-described probabilistic measure when superparticles 24 move from one cell to an adjacent cell.

Then, the simulator 12 terminates this processing.

According to the method of plasma particle simulation of the present embodiment (processing in FIG. 7), a weighting factor corresponding to the number of plasma particles 22 that a superparticle 24 represents in each cell becomes smaller as a cell in which the weighting factor is set is located closer to the solid wall surface 11a. Consequently, it is possible to maintain the number of superparticles 24 in cells near the solid wall surface 11a where the number of contained plasma particles 22 is small. It is also possible to prevent a statistical error from becoming large in the behavior calculation of superparticles 24, thereby preventing solution divergence in plasma particle distribution prediction.

In the above-described method of plasma particle simulation, the weighting factor is not changed in each cell in the bulk (see FIG. 5). Consequently, it is possible to prevent any unnecessarily small weighting factors from being set in some of cells in the bulk to cause an increase in the number of superparticles 24. Thus, it is possible to prevent the number of superparticles 24 from increasing unnecessarily as a whole, thereby preventing a calculation load (memory and time) and calculation costs from increasing unreasonably.

Also in the above-described method of plasma particle simulation, a weighting function used for the simulation is selected on the basis of the state of plasma predicted to be generated in the processing space S and a weighting factor is set in each cell using the selected weighting function. Consequently, it is possible to maintain an appropriate number of superparticles 24 in each cell according to the state of plasma.

In the above-described method of plasma particle simulation, there is a case that a function based on a trigonometric function (for example, function 2 shown in FIG. 5) is selected as the weighting function. Since a trigonometric function is a function the value of which changes drastically, the value of a weighting factor in the weighting function can be varied over three or more orders of magnitude according to a distance from a solid wall surface. Consequently, even if the state of plasma predicted to be generated in the processing space S is such that the number of plasma particles 22 in the sheath 23 drastically decreases in the vicinity of the solid wall surface, for example, decreases by three or more orders of magnitude, it is possible to precisely express the situation of the decrease and maintain an appropriate number of superparticles 24 in each cell.

Although in the present embodiment, the above-described weighting function is a function based on a power index or a trigonometric function, the weighting function is not limited to these functions but may be a function weighting factors of which become small as the cell is located closer to the solid wall surface 11a.

Also in the present embodiment, the simulator 12 may previously store on the hard disk 18, data on the initial distribution of plasma particles corresponding to various forms of plasma generated in the processing space S of the chamber 11, i.e., data on the initial distribution of plasma particles corresponding to each of a plurality of plasma states. At this time, the simulator 12 reads data on the initial distribution of plasma particles corresponding to a plasma state predicted from a user-input plasma processing recipe or the like from the hard disk 18 in step S74 of FIG. 7, and default-sets plasma particles 22 in each cell of the simulation model on the basis of the data read out (plasma particle default-setting step). Consequently, it is possible to start calculating the behavior of superparticles 24 on the basis of a plasma particle distribution similar to a real plasma particle distribution. As a result, it is possible to rapidly converge the behavior calculation of superparticles 24, and further improve the accuracy of the behavioral analysis of superparticles 24.

In addition, a method for calculating the behavior of superparticles 24 using data on the initial distribution of plasma particles is not limited to the above-described method in which data on the initial distribution is previously stored on the hard disk 18. The method also includes those in which the number of plasma particles to be set in each cell (i.e., the initial distribution of plasma particles) is determined on the basis of a selected weighting function (for example, a smaller number of plasma particles is set in a cell having a smaller weighting factor), and those in which the number of plasma particles to be set in each cell is manually input directly by an operator.

Next, an explanation will be made of a method of plasma particle simulation according to a second embodiment of the present invention.

The present embodiment is basically the same in constitution and operation as the above-described first embodiment. Therefore, the same parts of the constitution and operation will not be described again, but only the different parts thereof will be described hereinafter.

Figure 8:
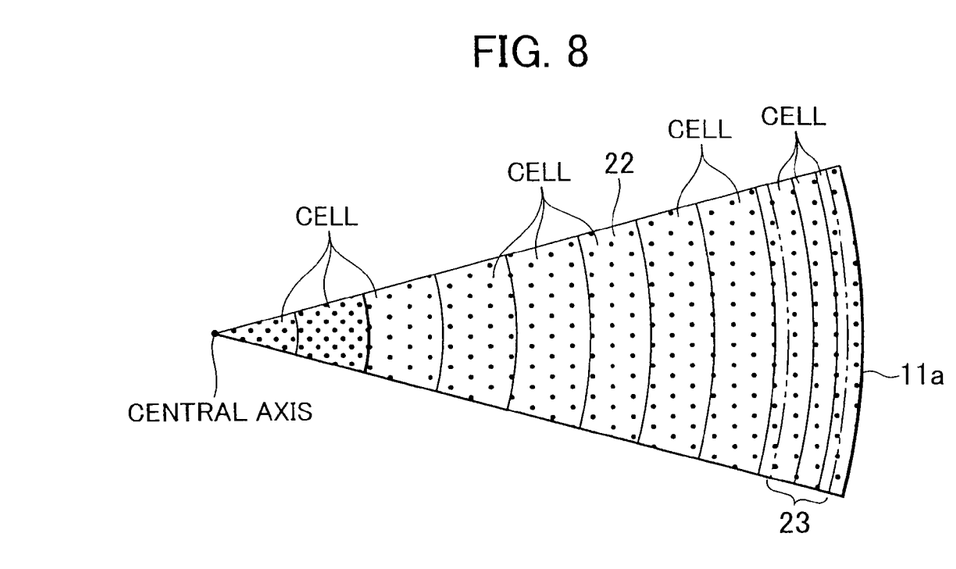
FIG. 8 is a top view illustrating a part of a simulation model corresponding to a processing space set in implementation of a method of plasma particle simulation according to a second embodiment of the present invention.

FIG. 8 is a top view illustrating a part of a simulation model corresponding to a processing space set in implementation of a method of plasma particle simulation according to the present embodiment.

In FIG. 8, a simulation model is divided axisymmetrically with respect to the central axis of a chamber 11 into a plurality of cells. At this time, the volumes of cells near the central axis become small. Since the density of plasma particles 22 is constant in a portion corresponding to the bulk of plasma (portion including the vicinity of the central axis), the number of plasma particles 22 contained in a cell near the central axis decreases. Likewise, the number of plasma particles 22 contained in a cell near the solid wall surface 11a also decreases due to the presence of a sheath.

In response to this situation, in the present embodiment, a weighting factor to be set in a cell is made smaller as the cell is located closer to the central axis. In addition, as with the first embodiment, a weighting factor to be set in a cell is made smaller as the cell is located closer to the solid wall surface 11a, thereby maintaining the number of superparticles 24 in each cell even if the number of plasma particles 22 decreases in the cell.

Figure 9:
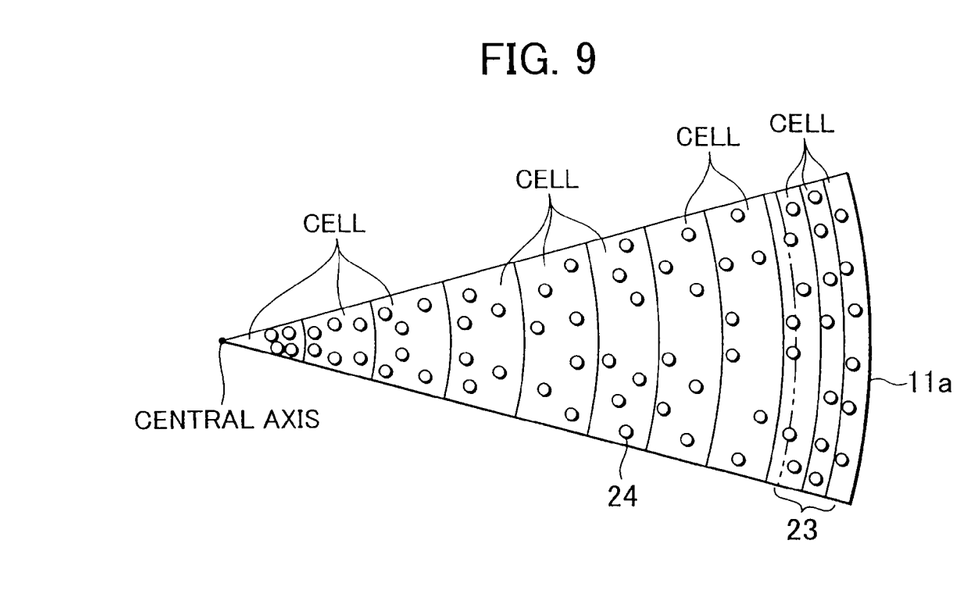
FIG. 9 is a top view illustrating a distribution of superparticles in each cell of the part of the simulation model shown in FIG. 8.

Consequently, as shown in FIG. 9, it is possible to maintain the number of superparticles 24 in a cell near the central axis almost the same as the number of superparticles 24 in a cell in the bulk, as well as maintain the number of superparticles 24 in a cell near the solid wall surface 11a almost the same as the number of superparticles 24 in a cell in the bulk.

According to the method of plasma particle simulation of the present embodiment, a smaller weighting factor is set in a cell located closer to the central axis, among a plurality of cells into which a simulation model corresponding to the processing space S has been divided axisymmetrically with respect to the central axis of the chamber 11. Consequently, it is possible to maintain an appropriate number of superparticles 24 even for a cell which is located closer to the central axis and, therefore, contains a smaller number of plasma particles 22, thereby preventing solution divergence in plasma particle distribution prediction and improving solution accuracy.

Note that in the above-described respective embodiments in which a weighting function based on a trigonometric function is used, it has been confirmed by the present inventor et al. that a plasma particle distribution as a solution obtainable by the simulation does not significantly differ from a real plasma particle distribution even if the used weighting function does not precisely reflects the actual state of plasma, as long as the weighting function reflects the actual state of plasma to a certain degree of precision.

In the above-described respective embodiments, the plasma processing apparatus 10 includes the simulator 12. However, the simulator 12 need not necessarily be included in the plasma processing apparatus 10 but may be installed separately. When the simulator 12 is included in the plasma processing apparatus 10, the simulator 12 can be utilized as a tool for verifying a plasma particle distribution in the plasma processing apparatus 10. When the simulator 12 is not included in the plasma processing apparatus 10, the simulator 12 can be utilized, for example, as a tool for predicting a plasma particle distribution in the plasma processing apparatus 10 the real hardware of which has not yet been manufactured.

Also in the above-described respective embodiments, the timing at which the simulator 12 implements a method of plasma particle simulation is optional. For example, the method may be implemented on a lot-by-lot basis or may be implemented after the completion of maintenance of the plasma processing apparatus 10.

It is to be understood that the object of the present invention may also be accomplished by supplying a computer with a storage medium in which a program code of software, which realizes the functions of the above described respective embodiments is stored, and causing a CPU of the computer to read out and execute the program code stored in the storage medium.

In this case, the program code itself read from the storage medium realizes the functions of the above described respective embodiments, and hence the program code and the storage medium on which the program code is stored constitute the present invention.

Examples of the storage medium for supplying the program code include a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied to a computer by downloading from another computer, a database, or the like, not shown, connected to the Internet, a commercial network, a local area network, or the like.

Further, it is to be understood that the functions of the above described respective embodiments may be accomplished not only by executing a program code read out by a computer, but also by causing an OS (operating system) or the like which operates on a CPU to perform a part or all of the actual operations based on instructions of the program code.

Further, it is to be understood that the functions of the above described respective embodiments may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program executed by an interpreter, or script data supplied to an OS.

What is claimed is:

1. A method of plasma particle simulation for analyzing the behavior of a plasma particle in plasma generated in a cylindrical-shaped housing chamber included by a plasma processing apparatus by calculating the behavior of a superparticle which is a virtual particle representing a plurality of plasma particles, comprising:

dividing a space within said cylindrical-shaped housing chamber into a plurality of cells;

setting a weighting factor corresponding to the number of said plasma particles represented by said superparticle in each of said divided cells;

setting superparticles in each of said divided cells using plasma particles contained in said divided cell and said set weighting factor; and calculating the behavior of said superparticles in each of said divided cells;

wherein a volume of each of said divided cells is set small in the vicinity of a peripheral portion of said cylindrical-shaped housing chamber, and said weighting factor is set small in said divided cell in the vicinity of the peripheral portion of said cylindrical-shaped housing chamber.

2. The method of plasma particle simulation according to claim 1, further comprising default-setting said plasma particles in each of said divided cells.

3. The method of plasma particle simulation according to claim 1, wherein a plurality of weighting functions representing a relationship between a distance of said divided cell from a solid wall surface and said weighting factor are prepared, one of said weighting functions is selected in said setting the weighting factor step on the basis of a state of plasma predicted to be generated within said cylindrical-shaped housing chamber, and said weighting factor is set in each of said divided cells using said selected weighting function.

4. The method of plasma particle simulation according to claim 3, wherein one of said plurality of weighting functions is based on a trigonometric function.

5. The method of plasma particle simulation according to claim 3, wherein one of said plurality of weighting functions is based on a power index-based function.

6. The method of plasma particle simulation according to claim 1, wherein an increase/decrease in the number of said superparticles is determined using a probabilistic measure when said superparticles move from one of said divided cells to another one of said divided cells adjacent thereto.

7. The method of plasma particle simulation according to claim 1, wherein a space within said cylindrical-shaped housing chamber is divided axisymmetrically with respect to the central axis thereof into the plurality of cells in said dividing step, and a smaller weighting factor is set in any of said divided cells located closer to said central axis in said setting the weighting factor step.

8. The method of plasma particle simulation according to claim 1, wherein the volume of each of said divided cells is set small in an area in which a sheath is generated.

9. A non-transitory computer-readable storage medium for storing a program, which when executed by a computer, causes the computer to implement a method of plasma particle simulation for analyzing the behavior of a plasma particle in plasma generated in a cylindrical-shaped housing chamber included by a plasma processing apparatus by calculating the behavior of a superparticle which is a virtual particle representing a plurality of plasma particles, said method comprising:
  dividing a space within said cylindrical-shaped housing chamber into a plurality of cells;
  setting a weighting factor corresponding to the number of said plasma particles represented by said superparticle in each of said divided cells;
  setting superparticles in each of said divided cells using plasma particles contained in said divided cell and said set weighting factor; and
  calculating the behavior of said superparticles in each of said divided cells;
  wherein a volume of each of said divided cells is set small in the vicinity of a peripheral portion of said cylindrical-shaped housing chamber, and
  said weighting factor is set small in said divided cell in the vicinity of the peripheral portion of said cylindrical-shaped housing chamber.

10. A plasma particle simulator for implementing a method of plasma particle simulation for analyzing the behavior of a plasma particle in plasma generated in a cylindrical-shaped housing chamber included by a plasma processing apparatus by calculating the behavior of a superparticle which is a virtual particle representing a plurality of plasma particles, comprising:
  a cell division unit adapted to divide a space within said cylindrical-shaped housing chamber into a plurality of cells;
  a weighting factor setting unit adapted to set a weighting factor corresponding to the number of said plasma particles represented by said superparticle in each of said divided cells;
  a superparticle setting unit adapted to set superparticles in each of said divided cells using plasma particles contained in said divided cell and said set weighting factor; and
  a behavior calculation unit adapted to calculate the behavior of said superparticles in each of said divided cells;
  wherein a volume of each of said divided cells is set small in the vicinity of a peripheral portion of said cylindrical-shaped housing chamber, and
  said weighting factor is set small in said divided cell in the vicinity of the peripheral portion of said cylindrical-shaped housing chamber.

11. A plasma processing apparatus provided with a cylindrical-shaped housing chamber in which plasma is generated and a plasma particle simulator for implementing a method of plasma particle simulation for analyzing the behavior of a plasma particle in plasma generated in said cylindrical-shaped housing chamber by calculating the behavior of a superparticle which is a virtual particle representing a plurality of plasma particles, wherein said plasma particle simulator includes:
  a cell division unit adapted to divide a space within said cylindrical-shaped housing chamber into a plurality of cells;
  a weighting factor setting unit adapted to set a weighting factor corresponding to the number of said plasma particles represented by said superparticle in each of said divided cells;
  a superparticle setting unit adapted to set superparticles in each of said divided cells using plasma particles contained in said divided cell and said set weighting factor; and
  a behavior calculation unit adapted to calculate the behavior of said superparticles in each of said divided cells;
  wherein a volume of each of said divided cells is set small in the vicinity of a peripheral portion of said cylindrical-shaped housing chamber, and
  said weighting factor is set small in said divided cell in the vicinity of the d peripheral portion of said cylindrical-shaped housing chamber.

* * * * *